United States Patent
Li et al.

(10) Patent No.: US 9,613,986 B2
(45) Date of Patent: Apr. 4, 2017

(54) ARRAY SUBSTRATE AND ITS MANUFACTURING METHOD, DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jing Li, Beijing (CN); Fang Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 247 days.

(21) Appl. No.: 14/388,182

(22) PCT Filed: Oct. 31, 2013

(86) PCT No.: PCT/CN2013/086376
§ 371 (c)(1),
(2) Date: Sep. 25, 2014

(87) PCT Pub. No.: WO2015/010384
PCT Pub. Date: Jan. 29, 2015

(65) Prior Publication Data
US 2016/0247821 A1 Aug. 25, 2016

(30) Foreign Application Priority Data
Jul. 24, 2013 (CN) .......................... 2013 1 0314225

(51) Int. Cl.
*H01L 27/12* (2006.01)
*H01L 29/786* (2006.01)
(Continued)

(52) U.S. Cl.
CPC ........ *H01L 27/124* (2013.01); *H01L 27/1222* (2013.01); *H01L 27/1288* (2013.01);
(Continued)

(58) Field of Classification Search
CPC ........... H01L 29/41733; H01L 29/4908; H01L 29/42384; H01L 29/78669; H01L 29/78666
(Continued)

(56) References Cited

U.S. PATENT DOCUMENTS 6,320,221 B1  11/2001  Choi et al.
2011/0101338 A1*  5/2011  Yamazaki ........... H01L 27/1225
                                                 257/43
2014/0175446 A1  6/2014  Xu et al.

FOREIGN PATENT DOCUMENTS

CN      103018991 A     4/2013
CN      103309105 A     9/2013
(Continued)

OTHER PUBLICATIONS

First Chinese Office Action Appln. No. 201310314225.X; Dated Jun. 8, 2015.
(Continued)

*Primary Examiner* — Cuong Q Nguyen
(74) *Attorney, Agent, or Firm* — Ladas & Parry LLP (57) ABSTRACT

An array substrate including: a base substrate and a thin film transistor unit provided on the base substrate; the thin film transistor unit comprises: a first gate electrode provided on the base substrate, a gate insulating layer provided on the first gate electrode, a source electrode disposed in a same layer as the first gate electrode, an active layer provided on the source electrode, a drain electrode provided on the active layer, and the gate insulating layer disposed between the first gate electrode and the source electrode. This array substrate
(Continued)

reduces a channel length of a conducting channel of the thin film transistor unit, and meanwhile increases an aperture ratio of a pixel.

15 Claims, 3 Drawing Sheets

(51) Int. Cl.
*G02F 1/1343* (2006.01)
*G02F 1/1362* (2006.01)
*G02F 1/1368* (2006.01)

(52) U.S. Cl.
CPC ...... *H01L 29/78642* (2013.01); *G02F 1/1368* (2013.01); *G02F 1/136286* (2013.01); *G02F 2001/134372* (2013.01)

(58) Field of Classification Search
USPC .............................................. 257/59–60, 72
See application file for complete search history.

(56) References Cited

FOREIGN PATENT DOCUMENTS

| CN | 203455564 U | 2/2014 |
|----|-------------|--------|
| JP | 2007-043137 A | 2/2007 |
| JP | 2010-045240 A | 2/2010 |

OTHER PUBLICATIONS

International Preliminary Report on Patentability Appln. No. PCT/CN2013/086376; Dated Jan. 26, 2016.
International Search Report Appln. No. PCt/CN2013/086376; Dated Apr. 16, 2014.

* cited by examiner

ARRAY SUBSTRATE AND ITS MANUFACTURING METHOD, DISPLAY DEVICE

TECHNICAL FIELD

Embodiments of the present invention relate to an array substrate and its manufacturing method, and a display device.

BACKGROUND

A thin film transistor liquid crystal display (TFT-LCD) has the advantages such as small size, low power consumption, free of radiation, and so on, and plays a leading role in the flat panel display area.

LCDs can be divided into various types according to different electric field forms. An advanced-super dimension switch (short for ADS) type TFT-LCD has wide viewing angle, high aperture ratio, high transmittance and the like advantages and thus is widely applied. An ADS type is a planar electric-field wide-viewing-angle technology, and its core technology properties are described as below: a multi-dimensional electric field is formed by an electric field generated at edges of slit electrodes that are in a same plane and an electric field generated between a slit electrode layer and a plate-like electrode layer, so that the liquid crystal molecules at all orientation between the slit electrodes and over the electrodes in a liquid crystal cell rotate can be subjected to rotations, and thus the work efficiency of liquid crystal and the light transmittance are increased. An ADS type switching technology can increase the picture quality of a TFT-LCD product, and has the advantages of high resolution ratio, high transmittance, low power consumption, wide viewing angle, high aperture ratio, low color difference, free of push mura, and so on. According to different applications, the improvements in the ADS technology comprise high transmittance I-ADS technology, high aperture ratio H-ADS, high resolution ratio S-ADS technology, and so on.

SUMMARY

Embodiments of the present invention provide an array substrate and its manufacturing method, and a display device. The array substrate reduces the channel length of the conducting channel of a thin film transistor unit, and meanwhile increases the aperture ratio of a pixel; and the manufacturing method can reduce the manufacturing difficulty of an array substrate, decrease the manufacturing costs, and increase the yield.

An aspect of the present invention provides an array substrate, which comprises: a base substrate and a thin film transistor unit provided on the base substrate. The thin film transistor unit comprises: a first gate electrode provided on the base substrate, a gate insulating layer provided on the first gate electrode, a source electrode disposed in a same layer as the first gate electrode, an active layer provided on the source electrode, a drain electrode provided on the active layer, and the gate insulating layer is disposed between the first gate electrode and the source electrode.

For example, the array substrate can further comprise: a data line and a gate line that are provided on the base substrate and cross with each other vertically and horizontally. The data line comprises a plurality of first data regions disposed in a same as the gate lines and insulated from the gate lines and a second data region provided on the first data regions and connected to adjacent first data regions, and the second data region and the gate line are partially overlapped with each other in an orthographic projection direction.

For example, the gate insulating layer is disposed on the first data regions and the gate line, first via holes are disposed in a portion of the gate insulating layer corresponding to the first data regions, and the second data region is provided on the gate insulating layer and electrically connected to the adjacent first data regions through the first via holes.

For example, the source electrode, the first gate electrode, the gate line and the first data regions of the data line are disposed in a same layer, and the source electrode and the second data region are provided in a same pattern layer.

The array substrate can further comprise: a first transparent conducting layer that is disposed on the thin film transistor unit, and the first transparent conducting layer and the drain electrode are integrally formed or electrically connected with each other.

For example, a passivation layer is disposed on the drain electrode and the first transparent conducting layer, a second transparent conducting layer is disposed on the passivation layer, and the first transparent conducting layer comprises at least a portion that overlaps the second transparent conducting layer.

For example, the array substrate can further comprise: a gate driver on array (GOA) unit provided on the base substrate. The GOA unit comprises: a second gate electrode provided on the base substrate, and a conducting leading wire provided on the second gate electrode; the first gate electrode and the second gate electrode are disposed in a same layer, and the conducting leading wire and the drain electrode are provided in a same pattern layer.

For example, a second via hole is disposed in a portion of the passivation layer corresponding to the conducting leading wire, and the second transparent conducting layer is electrically connected to the conducting leading wire through the second via hole.

For example, the first transparent conducting layer comprises a plate-like or a slit electrode, and the second transparent conducting layer comprises a slit electrode.

In the above-mentioned array substrate, when the first gate electrode of the thin film transistor unit is in operation, the channel length of the conducting channel is the thickness of the active layer, and by reducing the thickness of the active layer, the channel length can be decreased, thus the on-state current can be increased, a high aperture ratio of a pixel can be guaranteed in the meantime, and the display effect of a display device can be improved.

A second aspect of the present invention provides a display device, comprising the any one of the above-mentioned array substrates.

A third aspect of the present invention provides a manufacturing method of an array substrate; the array substrate comprises a thin film transistor unit, and the thin film transistor unit comprises a first gate electrode, a gate insulating layer, an active layer, a source electrode and a drain electrode; and the method comprises: forming a pattern that comprises the first gate electrode and the source electrode on a base substrate, and the first gate electrode and the source electrode being formed in a same layer; forming a pattern that comprises the gate insulating layer on the pattern that comprises the first gate electrode and the source electrode, and forming a pattern that comprises the active layer on the source electrode, and the gate insulating layer being formed on the first gate electrode and between the first gate electrode and the source electrode; and forming a pattern that comprises the drain electrode on the active layer.

For example, the array substrate comprises a gate line and a data line that cross with each other vertically and horizontally, and the data line comprises adjacent first data regions spaced by the gate line and a second data regions electrically connected to adjacent first data regions. In the manufacturing method, a pattern that comprises the first gate electrode, the source electrode, the gate line, and the first data regions of the data line is formed in a same layer on the base substrate; after a pattern that comprises the active layer is formed on the source electrode, a pattern of first via holes is formed in the gate insulating layer corresponding to the first data regions; and a pattern that comprises the drain electrode, the second data region of the data line is formed on the active layer, and the second data region is electrically connected to the adjacent first data region through the first via holes.

In the above-mentioned manufacturing method, for example, a pattern that comprises the drain electrode and a first transparent conducting layer is formed in a same layer on the active layer.

In the above-mentioned manufacturing method, for example, the manufacturing method can further comprise: forming a pattern that comprises a passivation layer and a pattern of a second transparent conducting layer on a pattern of the drain electrode sequentially.

For example, the array substrate can further comprise forming a gate driver on array (GOA) unit, and the GOA unit comprise a second gate electrode and a conducting leading wire; accordingly, the manufacturing method can further comprise: forming a pattern that comprises the first gate electrode, the source electrode, the gate line, the first data regions of the data line, and the second gate electrode in a same layer on the base substrate; and forming a pattern that comprises the drain electrode, the first transparent conducting layer, the second data region of the data line and the conducting leading wire on the active layer.

In the above-mentioned manufacturing method, for example, a second via hole is disposed in a portion of the passivation layer corresponding to the conducting leading wire, and the second transparent conducting layer is electrically connected to the conducting leading wire through the second via hole.

For example, the above-mentioned manufacturing method can use five masking processes to complete, and the manufacturing method can comprise: a metal thin film and a semiconductor thin film are sequentially formed on the base substrate, a pattern that comprises the first gate electrode of the thin film transistor unit, the source electrode and the active layer, the gate line, first data regions of a data line and a second gate electrode of the gate driver on array (GOA) unit is etched and formed through a first masking process; a first insulating thin film is formed, a pattern that comprises the gate insulating layer is formed through a second masking process, and a pattern of first via holes is formed in the gate insulating layer corresponding to the first data region; a first transparent thin film is formed, a pattern that comprises the drain electrode of the thin film transistor unit and a first transparent conducting layer, a second data region of the data line and a conducting leading wire of the gate driver on array unit is etched and formed on the active layer through a third masking process, and the second data region and adjacent first data regions are electrically connected through the first via holes; a second insulating thin film is formed, a pattern that comprises a passivation layer is etched and formed on a pattern of the drain electrode through a fourth masking process, and a pattern of a second via hole is formed in a portion of the passivation layer corresponding to the conducting leading wire; and a second transparent conducting layer is formed, a pattern that comprises the second transparent conducting layer is etched and formed through a fifth masking process, and the second transparent conducting layer and the conducting leading wire are electrically connected through the second via hole.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE SIGNS OF DRAWINGS

1: base substrate; 2: thin film transistor unit; 21: first gate electrode;
22: gate insulating layer; 23: source electrode; 24: active layer;
25: drain electrode; 3: data line; 31: first data region;
32: second data region; 4: gate line; 5: first via hole;
6: first transparent conducting layer; 7: passivation layer;
8: second transparent conducting layer; 9: GOA unit;
91: second gate electrode; 92: conducting leading wire;
10: second via hole; 11: metal thin film; 12: semiconductor thin film;
13: photoresist.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention.

During research, the inventors found that the channel length of the conducting channel of a TFT in a conventional ADS type liquid crystal panel is larger due to the limitations of process factors, which not only reduces the value of the on-state current, but also indirectly limits the increase in the aperture ratio of a pixel; and in general, only if seven masking processes are used, the array substrate of the conventional ADS type liquid crystal panel can be manufactured, so the manufacturing difficulty and costs become higher, and the yield rate is lowered.

Embodiments of the present invention provide an array substrate and its manufacturing method, and a display device; the array substrate reduces the channel length of the conducting channel of a thin film transistor unit, and meanwhile increases the aperture ratio of a pixel; and the manufacturing method can reduce the manufacturing difficulty of an array substrate, decrease the manufacturing costs, and increase the yield rate.

First Embodiment

Figure 1:
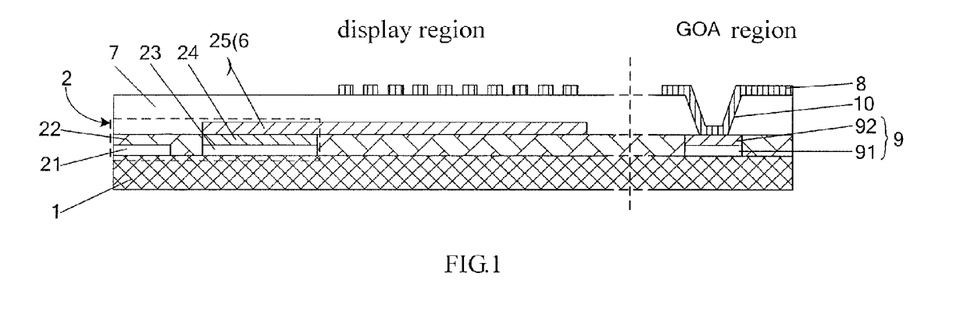
FIG. 1 is a first schematic view illustrating a structure of an array substrate in an embodiment of the present invention.

The embodiment provides an array substrate, as illustrated in FIG. 1, which comprises: a base substrate 1 and a thin film transistor unit 2 provided on the base substrate 1; and generally a plurality of the thin film transistor units 2 can be included, and the plurality of the thin film transistor units 2 is provided in a display region of the array substrate.

The thin film transistor unit 2 comprises: a first gate electrode 21 provided on the base substrate 1, a gate insulating layer 22 provided on the first gate electrode 21, a source electrode 23 disposed in a same layer as the first gate electrode 21, an active layer 24 provided on the source electrode 23, and a drain electrode 25 provided on the active layer 24; and the gate insulating layer 22 is disposed between the first gate electrode 21 and the source electrode 23.

In order to guarantee that image signals be written into liquid crystal pixels timely and accurately during row scanning periods, the on-state current $I_{on}$ of the thin film transistor unit 2 of each pixel should be large enough and greater than $10^{-6}$ A generally. According to related theories, it can be known that the on-state current $I_{on} \propto (W/L)$; W is the channel width of the conducting channel of a TFT, and L is the channel length of the conducting channel of the TFT. If the channel length L remains constant, as the channel width W increases, the on-state current $I_{on}$ arises but the aperture ratio of the pixel decreases; therefore, in the actual use, it's better that the channel length L of a TFT is shorter on the premise that the lithographic accuracy and the yield are guaranteed. But sometimes the channel length L cannot be made small enough due to the limitations of a masking process, and this indirectly restricts the increase in the aperture ratio of the pixel.

In the embodiment, as illustrated in FIG. 1, when the first gate electrode 21 is in operation, the channel length L is the thickness of the active layer 24; as long as the thickness of the active layer 24 is reduced, the channel length L can be decreased, to increase the on-state current $I_{on}$, guarantee a high aperture ratio of the pixel in the meantime, and improve the display effect of a display device.

The embodiment provides an array substrate, and the array substrate comprises a thin film transistor unit. When the first gate electrode of the thin film transistor unit is in operation, the channel length of a conducting channel is the thickness of an active layer; as long as the thickness of the active layer is reduced, the channel length can be decreased, and thus to increase the on-state current, guarantee a high aperture ratio of a pixel in the meantime, and improve the display effect of a display device.

For example, the base substrate 1 can be made of a common transparent material such as glass, quartz or the like; the first gate electrode 21 or the source electrode 23 can have a thickness of from 100 nm to 500 nm, for example, can be made of a single-layer metal such as one of molybdenum, aluminum, tungsten, titanium and copper or any of their alloys, and can also be made of a multi-layer combination of the above-mentioned metals. For example, the first gate electrode 21 and the source electrode 23 can further be made of a same material.

Figure 2:
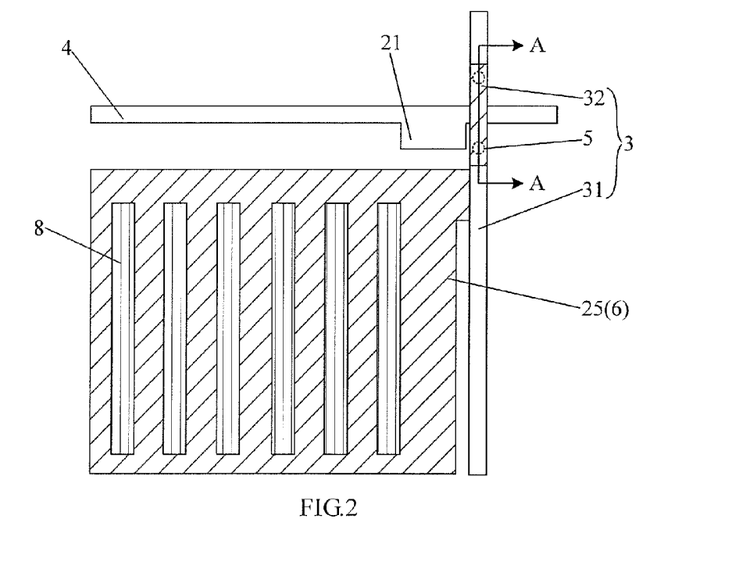
FIG. 2 is a plane view schematically illustrating an array substrate in an embodiment of the present invention.
Figure 3:
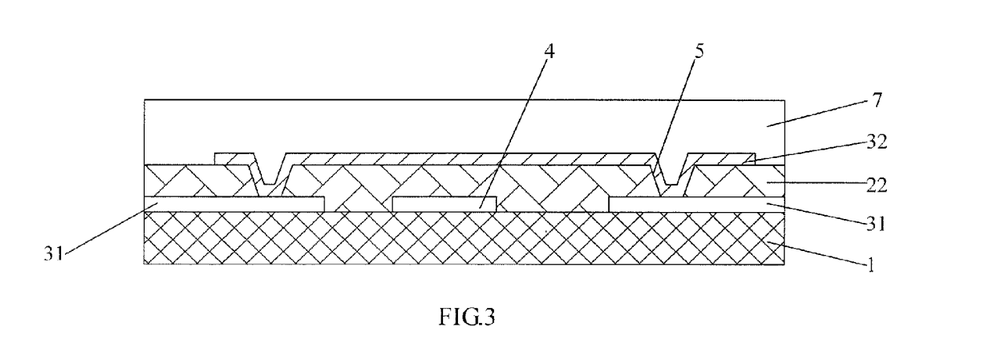
FIG. 3 is a schematic cross-sectional view of FIG. 2 taken along AA in an embodiment of the present invention.

In the embodiment, for example, the active layer 24 can be formed of a commonly used semiconductor material such as amorphous silicon, poly-silicon, indium gallium zinc oxide (IGZO) or the like, the thickness of which can be from 100 nm to 300 nm. For example, the drain electrode 25 can comprise a common transparent conducting material such as tin indium oxide, indium zinc oxide or the like, the thickness of which can be from 50 nm to 500 nm. Further, as illustrated in FIG. 2, the display region further comprises a data line 3 and a gate line 4 that are provided on the base substrate and cross with each other vertically and horizontally. Generally a plurality of the data lines 3 and the gate lines 4 can be included; as illustrated in FIG. 3, each data line 3 can comprise: a plurality of first data regions 31 disposed in a same layer as the gate lines 4 and insulated from the gate lines 4 and second data regions 32 provided on the first data regions 31 and connected to adjacent first data regions 31, and the second data regions 32 and the gate lines 4 are partially overlapped with each other in an orthographic projection direction.

The first data regions 31 and the second data regions 32 are electrically connected with each other to form a complete data line 3. Along the extending direction of a data line 3, adjacent two first data regions 31 are provided on the two sides of a gate line 4, and the second data region 32 that connects these two first data regions 31 crosses the gate line 4 accordingly.

Further, a gate insulating layer 22 is disposed on the first data regions 31 and the gate line 4; first via holes 5 are each disposed in a portion of the gate insulating layer 22 corresponding to the first data region 31; and the second data region 32 is provided on the gate insulating layer 22 and electrically connected to the adjacent first data regions through the first via holes 5. Preferably, two first via holes 5 are provided, and respectively provided in portions of the adjacent two first data regions 31 close to the gate line 4, symmetrical with respect to the gate line 4.

Because signals transferred by the gate line 4 and the data line 3 are different, the gate line 4 and the data line 3 have to be insulated from each other. But as illustrated in FIG. 2, in the display region, there's an overlapping portion between the gate line 4 and the data line 3 in the orthographic projection direction. In the embodiment, the source electrode 23 and the first gate electrode 21 are disposed in a same layer; it's required that the gate line 4 and the first gate electrode 21 are disposed in a same layer and integrally formed without increasing the number of used masks, and it's also required that the data line 3 and the source electrode 23 are disposed in a same layer and integrally formed.

In order to guarantee the insulation between the gate line and the data line, with respect to FIG. 2 and FIG. 3, the data line is divided into two kinds of regions: the first data regions 31 and the second data regions 32. The first data regions 31 and the gate line 4 are disposed in a same layer, separated and insulated from each other. For example, each thin film transistor unit 2 corresponds to one first data region 31; the second data regions 32 are provided on the gate insulating layer 22; and through the first via holes 5 that are disposed in the gate insulating layer 22 and correspond to the first data regions 31, the first data regions 31 that are insulated from each other and correspond to two adjacent thin film transistor units 2 are electrically connected, to realize the normal transmission of data signals over the data line 3.

For example, the second data region 32 and the drain electrode 25 can be disposed in a same layer and provided in a same pattern layer, namely, the second data regions 32 are formed at the time when the drain electrode 25 is formed through a patterning process. Accordingly, for example, the second data region 32 can adopt a common transparent conducting material such as tin indium oxide, indium zinc oxide or the like, the thickness of which can be from 50 nm to 500 nm.

In the embodiment, the source electrode 23, the first gate electrode 21, the gate line 4, the first data regions 31 of the data line 3 are disposed in a same layer, and the drain electrode 25 and the second data region 32 are provided in a same pattern layer.

In addition, it can be seen from FIG. 2 that the first gate electrode 21 and the gate line 4 are integrally formed. In order to increase the control ability of the first gate electrode 21 for the conducting channel of the active layer 24, the first gate electrode 21 is protruded from the gate line 4.

Further, as illustrated in FIG. 1, a first transparent conducting layer 6 is disposed on the thin film transistor unit 2, and the first transparent conducting layer 6 and the drain electrode 25 can be integrally formed and electrically connected with each other.

A passivation layer 7 is disposed on the drain electrode 25 and the first transparent conducting layer 6. A passivation layer process can not only increase the resistance ability to a harsh environment for a display device, but also is helpful to improve the photoelectric performance parameters of a TFT. In the embodiment, a second transparent conducting layer 8 is disposed on the passivation layer 7, and at least a portion of the first transparent conducting layer 6 overlaps the second transparent conducting layer 8.

Because the first transparent conducting layer 6 and the drain electrode 25 are integrally formed, which means the connection between the first transparent conducting layer 6 and the drain electrode 25, and here, the first transparent conducting layer 6 can be called as a pixel electrode; accordingly, the second transparent conducting layer 8 can be called as a common electrode. The first transparent conducting layer 6 and the second transparent conducting layer 8 cooperate to generate an electric field parallel to the base substrate 1, and to drive the liquid crystal of an ADS type liquid crystal panel to rotate.

In the embodiment of the present invention, the first transparent conducting layer 6 can be a plate-like electrode or a slit electrode, and the second transparent conducting layer 8 is a slit electrode.

The second transparent conducting layer 8 can be a common transparent conducting material such as tin indium oxide, indium zinc oxide or the like, and for example, the thickness can be from 50 nm to 500 nm.

Further, in the embodiments of the present invention, besides the common transparent conducting material such as tin indium oxide, indium zinc oxide or the like, the drain electrode 25 can also be made of a single-layer metal such as one of molybdenum, aluminum, tungsten, titanium and copper or any of their alloys, or be made of a multi-layer combination of the above-mentioned metals. Here, because a metal or its alloy is not transparent, in order to avoid decreasing the aperture ratio of the array substrate, the first transparent conducting layer 6 is still made of the common transparent conducting material such as tin indium oxide, indium zinc oxide or the like. In order to increase the reliability of the electrical connection between the drain electrode 25 and the first transparent conducting layer 6, the first transparent conducting layer 6 can partially disposed on the drain electrode 25, to realize the electrical connection between the two, as illustrated in FIG. 4.

In addition, in order to further improve the display effect of a display device, more and more people begin to pay attention to the narrow bezel design of a display device. A conventional technology generally uses a method of minimizing the process margin to the limit to manufacture a display with a narrow bezel, and one very important technology is the gate driver on array (GOA) technology. A gate switch circuit is integrated on the array substrate of the display panel of a display device by using the GOA technology to realize the scan drive for the display panel, and thus the gate driving integrated circuit part can be omitted, the production costs can be reduced from both aspects of material cost and preparation process, and the display device can realize an attractive design in symmetrical sides and a narrow bezel.

Figure 4:
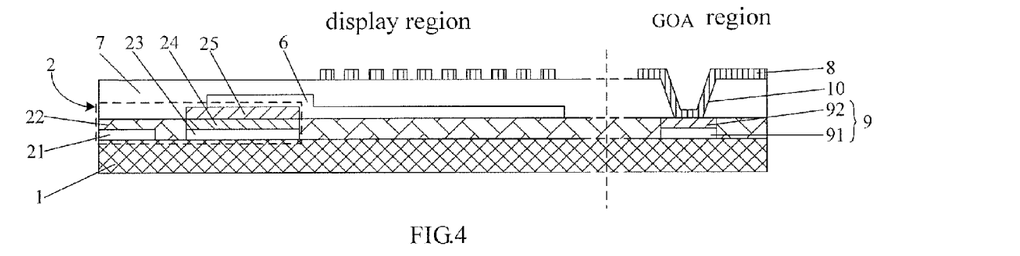
FIG. 4 is a second schematic view illustrating a structure of an array substrate in an embodiment of the present invention.

Therefore, in the embodiment, as illustrated in FIG. 1 or FIG. 4, the array substrate can further comprise: a gate driver on array (GOA) unit 9 provided on the base substrate 1, and the GOA unit 9 is provided in the GOA region of the array substrate. The GOA unit 9 comprises: a second gate electrode 91 provided on the base substrate 1 and a conducting leading wire 92 provided on the second gate electrode 91.

Further, in the embodiment of the present invention, for example, the first gate electrode 21 and the second gate electrode 91 of the thin film transistor unit 2 are disposed in a same layer, and the conducting leading wire 92 and the drain electrode 25 are provided in a same pattern layer.

It is to be noted that, the second transparent conducting layer 8 in the GOA region is used for connecting a gate driver circuit and receiving the electrical signals from the gate driver circuit; after passing through the conducting leading wire 92 and the second gate electrode 91, the electrical signals are transferred to the first gate electrode 21 of the thin film transistor unit 2 through the gate line on the array substrate to drive the thin film transistor unit 2 to work.

In order to guarantee the reliable connection between the second transparent conducting layer 8 in the GOA region and the first gate electrode 21 of the thin film transistor unit 2, preferably, a second via hole 10 is disposed in a portion of the passivation layer 7 corresponding to the conducting leading wire 92, and the second transparent conducting layer 8 can be electrically connected to the conducting leading wire 92 through the second via hole 10, and thus realize the connection to the gate line 4 and first gate electrode 21 through the second gate electrode 91. Such a connection way needs a simple processing technology and has stable connection effect.

In the embodiment of the present invention, in order to benefit the connection of the second gate electrode 91, the gate line 4 and the first gate electrode 21, for example, the second gate electrode 91, the gate line 4 and the first gate electrode 21 can be disposed in a same layer and be integrally formed.

An embodiment of the present invention further provides a display device, which comprises any of the above-mentioned array substrates. The display device can be any product or component that has a display function, such as a liquid crystal panel, an electronic paper, an organic light-emitting diode (OELD) display panel, a mobile phone, a tablet computer, a television, a display, a laptop computer, a digital photo-frame, a navigating instrument or the like.

Second Embodiment

The embodiment of the present invention provides a manufacturing method of an array substrate as illustrated in FIG. 1, and the method comprises the following process of forming a thin film transistor unit:

Step S11: a pattern that comprises a first gate electrode and a source electrode is formed on a base substrate, and the first gate electrode and the source electrode is formed in a same layer.

Step S12: a pattern that comprises a gate insulating layer is formed on the pattern formed in step S11, and a pattern that comprises an active layer is formed on the source electrode. The gate insulating layer is formed on the first gate electrode, and between the patterns of the first gate electrode and the source electrode.

Step S13: a pattern that comprises a drain electrode is formed on the active layer formed in the step S12.

In addition, the manufacturing method of an array substrate provided by the embodiment can further comprise the following process of forming a data line and a gate line: in the step S11, a pattern that comprises the first gate electrode, the source electrode, the gate line, the first data regions of the data line is formed in a same layer on the base substrate; in the step S12, first via holes are formed in the gate insulating layer corresponding to the first data region; and in the step S13, a pattern that comprises the drain electrode and a second data region of the data line is formed in a same layer, and the second data region electrically connects an adjacent first data regions through the first via holes.

Further, a pattern that comprises the drain electrode and a first transparent conducting layer can be formed in a same layer in the step S13.

On the basis of the above-mentioned manufacturing method, the embodiment can further comprise:

Step S14: a pattern that comprises a passivation layer and a pattern that comprises a second transparent conducting layer are sequentially formed on the pattern formed in the step S13.

The manufacturing method of an array substrate provided by the embodiment can further comprise a process of forming a gate driver on array unit, which comprises: in the step S11, a pattern that comprises the first gate electrode, the source electrode, the gate line, the first data regions of the data line, and the second gate electrode is formed in a same layer on the base substrate; in the step S13, a pattern that comprises the drain electrode, the first transparent conducting layer, the second data region of the data line, and the conducting leading wire is formed in a same layer.

Different structures disposed in a same layer can be formed in a same patterning process, and can also be formed in a plurality of patterning processes respectively, and there are no limitations in the embodiment.

Still further, in the step S14, a second via hole is disposed in a portion of the passivation layer corresponding to the conducting leading wire, and the second transparent conducting layer electrically connects the conducting leading wire through the second via hole.

In the embodiment, the source electrode, the first gate electrode and the gate line of the array substrate manufactured in the above-mentioned manufacturing method of an array substrate are formed in a same layer, and can be formed together in a same patterning process; similarly, the first gate electrode and the first data regions are formed in a same layer.

In the embodiment, the first transparent conducting layer 6 can be a plate-like electrode or a slit electrode, and the second transparent conducting layer 8 is a slit electrode.

A specific example of the above-mentioned manufacturing method of an array substrate will be described in the following. Obviously, it is only a specific manufacturing method of the array substrate illustrated in FIG. 1; besides, the array substrate illustrated in FIG. 1 can be manufactured using other methods.

In the exemplary manufacturing method, when in the array substrate a plurality of thin film transistor units 2, a plurality of the gate lines 4 and a plurality of the data lines 3 and a plurality of the gate driver on array units 9 are prepared, only five masking processes can be used, which respectively comprise the following steps:

Step S101: a metal thin film and a semiconductor thin film are sequentially formed on a base substrate; a pattern that comprises the first gate electrode of the thin film transistor unit, the source electrode and the active layer, the gate line, the first data regions of the data line and the second gate electrode of the gate driver on array unit is etched and formed through a first masking process.

Figure 5A:
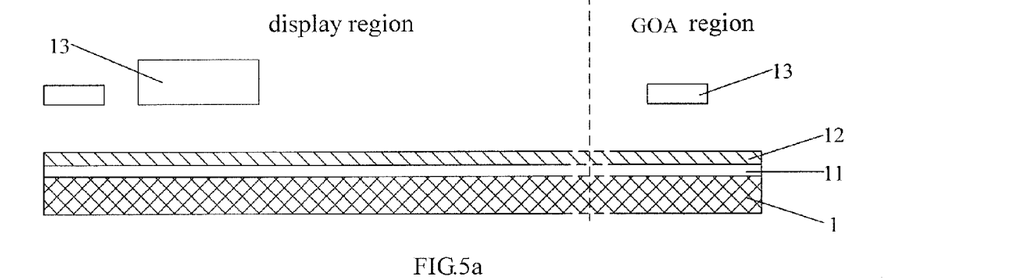
FIGS. 5a~5b are schematic view illustrating a manufacturing process of an array substrate structure in an embodiment of the present invention.
Figure 5B:
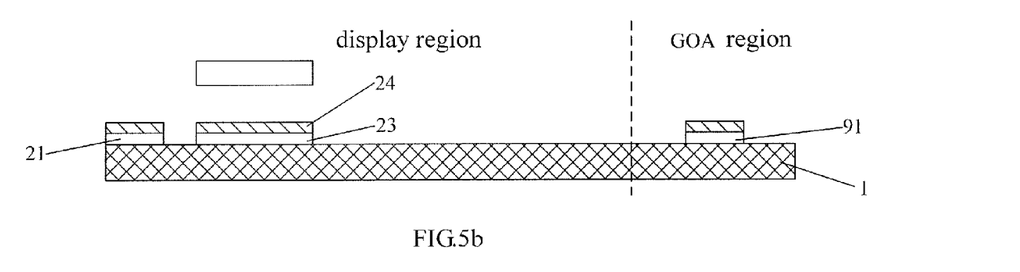
Figure 6:
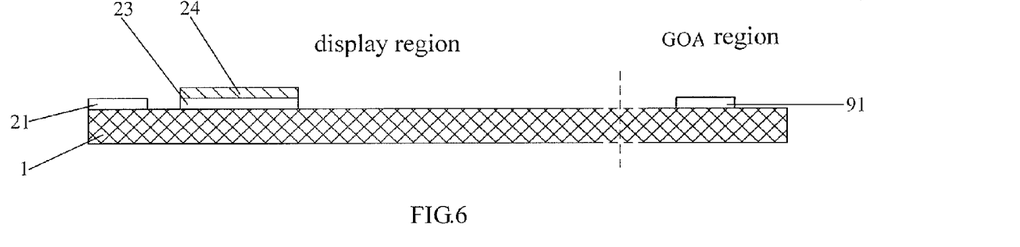
FIG. 6 is a third schematic view illustrating a structure of an array substrate in an embodiment of the present invention.

As illustrated in FIG. 5*a*, FIG. 5*b* and FIG. 6, for example, a metal thin film 11 is formed on the base substrate 1 by using a magnetron sputtering, a thermal evaporation or the like method, followed by depositing a semiconductor thin film 12 through a plasma enhanced chemical vapor deposition (PECVD) method. Through the first masking process, a pattern that comprises the gate line 4, the first data regions 31 (not shown in the drawings) in FIG. 2 and the first gate electrode 21 in the thin film transistor unit 2, the source electrode 23, the active layer 24, and the second gate electrode 91 of the GOA unit is formed simultaneously; the gate line 4 and the first gate electrode 21, the second gate electrode 91 are integrally formed, the first data regions 31 and the source electrode 23 are integrally formed, and this not only strengthens the connection between them, but also reduces processes, and in the meantime, simplifies the layer structure of the array substrate.

For example, in the first masking process, photoresist 13 is coated on the semiconductor thin film 12; a two-tone mask, for example, a half-tone or a gray-tone mask is used to perform an exposure, so that the photoresist forms a complete-exposed region, an unexposed region and a partially-exposed region; a pattern of the photoresist 13 is obtained after development for the photoresist during the developing process, as illustrated in FIG. 5*a*. The semiconductor thin film 12 and the metal thin film 11 that correspond to the complete-exposed region are etched by using the pattern of the photoresist 13 through an etching process, to form a pattern that comprises the source electrode 23, the first gate electrode 21, the first data regions 31 (not shown in the drawing), the gate line 4 (not shown in the drawing) and the second gate electrode 92; the photoresist 13 in the partially-exposed region are removed through an ashing process, to expose the semiconductor thin film 12 that corresponds to the partially-exposed region; and the exposed semiconductor thin film 12 is completely etched through an etching process to form a pattern that comprises the active layer 24 of thin film transistor unit 2, as illustrated in FIG. 5*b*; and finally, the rest photoresist 13 is stripped to form the array substrate illustrated in FIG. 6.

For example, the material of the base substrate 1 is generally glass or quartz; the metal thin film 11 can be made of a single-layer metal such as one of molybdenum, aluminum, tungsten, titanium and copper or any of their alloys, and can also be made of a multi-layer combination of the above-mentioned metals, with a thickness of from 50 nm to 500 nm; for example, the semiconductor thin film 12 can be formed of a semiconductor material such as amorphous silicon, poly-silicon, indium gallium zinc oxide or the like, with a thickness of from 100 nm to 300 nm.

Step S102: a first insulating thin film is formed, a pattern that comprises the gate insulating layer is etched and formed through a second masking process, and the first via holes are formed in the gate insulating layer corresponding to the first data regions.

Figure 7:
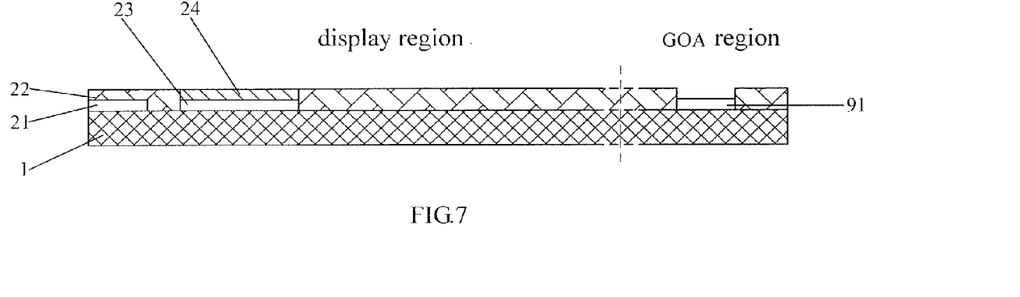
FIG. 7 is a fourth schematic view illustrating a structure of an array substrate in an embodiment of the present invention.

On the basis of the structure of the array substrate illustrated in FIG. 6, for example, a layer of the first insulating thin film is deposited by using a PECVD method; in the second masking process, patterns of the gate insulating layer 22, exposing the active layer 24 and of the second gate electrode 91 of the GOA unit 9, are formed by using a common mask through a patterning process, as illustrated in FIG. 7. The gate insulating layer 22 is provided on the first gate electrode 21, and the gate insulating layer 22 (this part of the gate insulating layer 22 is provided on the base substrate 1) is provided between the first gate electrode 21 and the source electrode 23.

Further, as illustrated in FIG. 3, both the gate line 4 and the first data regions 31 are covered with the gate insulating layer 22 thereon, and in order to guarantee the insulation between the gate line 4 and the data line 3, the gate insulating layer 22 (this part of the gate insulating layer 22 is provided on the base substrate 1) is provided between the gate line 4 and the first data regions 31. In the embodiment, the formed pattern of the gate insulating layer 22 further comprises first via holes 5 corresponding to the first data regions 31.

For example, the gate insulating layer 22 comprises silicon oxide as an insulating material, preferably; in the meantime, it can also use silicon nitride, hafnium oxide or the like insulating material, and can also be of a multi-layer combination of the above-mentioned insulating materials, with a thickness of from 100 nm to 300 nm.

Step S103: a first transparent thin film is formed, a pattern that comprises the drain electrode of the thin film transistor unit and the first transparent conducting layer, the second data region of the data line and the conducting leading wire of a GOA is etched and formed through a third masking process, and the second data region electrically connects the adjacent first data regions through the first via holes.

On the basis of the structure of the array substrate illustrated in FIG. 7, for example, a layer of the first transparent thin film is formed by using a magnetron sputtering, a thermal evaporation or the like method, and the first transparent thin film can adopt tin indium oxide, indium zinc oxide or the similar material, with a thickness of from 50 nm to 500 nm; a pattern that comprises the drain electrode 25 and the first transparent conducting layer 6 is formed using a common mask through a patterning process in the display region, and the first transparent conducting layer 6 and the drain electrode 25 are integrally formed, which increases the transmission reliability of signals between the drain electrode 25 and the first transparent conducting layer 6.

Meanwhile, in the step S103, a pattern that comprises the second data region 32 can be further formed, and the second data region 32 can electrically connect the adjacent first data regions 31 through the first via holes 5 in the gate insulating layer 22; two first data regions 31 that are insulated from each other can be connected to form a data line 3, as illustrated in FIG. 3.

Figure 8:
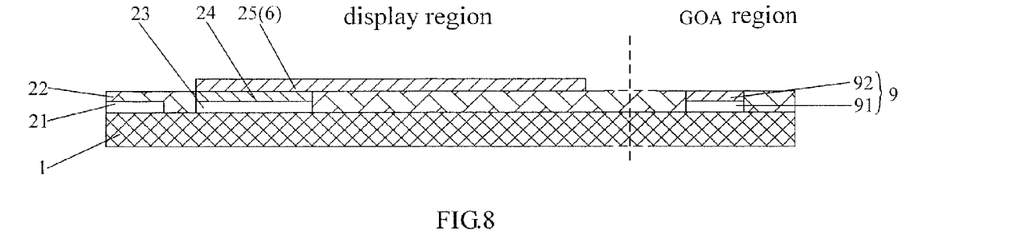
FIG. 8 is a fifth schematic view illustrating a structure of an array substrate in an embodiment of the present invention.

Besides, in the step S103, a pattern that comprises the conducting leading wire 92 in the GOA region can further be formed using the first transparent thin film, to form the structure of the array substrate illustrated in FIG. 8.

Step S104: a second insulating thin film is formed, a pattern that comprises a passivation layer is etched and formed through a fourth masking process, and a second via hole is disposed in a portion of the passivation layer corresponding to the conducting leading wire.

On the basis of the structure of the array substrate in FIG. 8, for example, a layer of the second insulating thin film is deposited by using a PECVD method, and similarly, the second insulating thin film can adopt a same material as the gate insulating layer 22, with a thickness of from 100 nm to 300 nm. In the fourth masking process, the second insulating thin film is etched by using a common mask through a patterning process, to form a pattern that comprises the passivation layer 7, and the second via hole 10 is disposed in a portion of the passivation layer 7 corresponding to the conducting leading wire 92, as illustrated in FIG. 9.

Step S105: a second transparent conducting thin film is formed, a pattern that comprises the second transparent conducting layer is etched and formed through a fifth masking process, and the second transparent conducting layer and the conducting leading wire are electrically connected through the second via hole.

Figure 9:
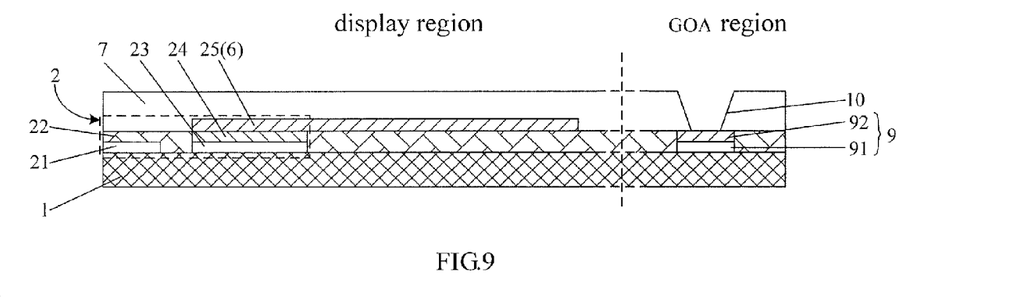
FIG. 9 is a sixth schematic view illustrating a structure of an array substrate in an embodiment of the present invention.

On the basis of the structure of the array substrate illustrated in FIG. 9, for example, a layer of the second transparent conducting thin film is formed by using a magnetron sputtering, a thermal evaporation or the like method, and the second transparent conducting thin film can adopt tin indium oxide, indium zinc oxide or the like material, with a thickness of from 50 nm to 500 nm. A pattern that comprises the second transparent conducting layer 8 is formed by using a common mask through a patterning process, and the electrical connection between the second transparent conducting layer 8 and the conducting leading wire 92 is realized through the second via hole 10. Thus, the array substrate illustrated in FIG. 1 can be obtained.

In the embodiment, the second transparent conducting layer 8 is a slit electrode.

It is to be noted that, the second transparent conducting layer 8 in the GOA region is used for connecting a gate driver circuit and receiving the electrical signals from the gate driver circuit, and the electrical signals is transferred to the thin film transistor unit 2 of the array substrate after passing through the conducting leading wire 92 and the gate line 4, to drive the thin film transistor unit 2 to work.

To sum up, the above-mentioned example use five masking processes only to realize the manufacture of an array substrate, and as compared with a conventional technology, can reduce two masking processes, decrease the manufacturing difficulty and manufacturing costs, and increase the yield rate of the manufactured array substrate.

In the manufacturing method illustrated in the embodiments, the drain electrode 25 and the first transparent conducting layer 6 are integrally formed using the first transparent thin film in a same patterning process. If the drain electrode 25 is made of a metal, the metal can be of a single-layer metal such as one of molybdenum, aluminum, tungsten, titanium, copper or any of their alloys, and can also be of a multi-layer combination of the above-mentioned metals. Here, because metal is not transparent, in order to guarantee the aperture ratio of the array substrate, the first transparent conducting layer 6 and the drain electrode 25 are unable to be integrally fainted with a metal material similarly, and thus two patterning processes are required to manufacture and form the drain electrode 25 and the first transparent conducting layer 6 that is disposed in a same layer as the drain electrode 25 and connects the same, which is equivalent to the realization of manufacture of the array substrate with six masking processes.

In order to increase the reliability of the electrical connection between the drain electrode 25 and the first transparent conducting layer 6, the first transparent conducting layer 6 can partially disposed on the drain electrode 25, namely, partially overlap on the drain electrode 25, as illustrated in FIG. 4.

Please note that herein the patterning process may only comprise a photolithography process, or comprise the photolithography process and an etching step, and may also comprise printing, ink-jet or other similar processes used for faulting a predetermined pattern; the photolithography process refers to a process including film-forming, exposing, developing, and the like process and using photoresist, a mask, an exposure machine and the like to form a pattern. The corresponding patterning process can be chosen according to the formed structure in the embodiments of the present invention. The five or six masking processes denoted in the embodiments of the present invention refer to that five or six masks are used; the photolithography process, etching step or the other processes may also be used; the term masking process is used for comparing with the conventional seven mask processes, but it does not represent that the process of the embodiments of the present invention only comprises this process using a mask; and the rest processes can be selected according to the need. The common mask in the embodiments of the present invention is called compared with a two-tone mask, and when a single-tone mask or a common mask is used, it's required to make corresponding modifications according to the different formed patterns.

What are described above is related to the illustrative embodiments of the disclosure only and not limitative to the scope of the disclosure; the scopes of the disclosure are defined by the accompanying claims.

The invention claimed is:

1. An array substrate, comprising: a base substrate and a thin film transistor unit provided on the base substrate,
   wherein the thin film transistor unit comprises:
     a first gate electrode provided on the base substrate,
     a gate insulating layer provided on the first gate electrode,
     a source electrode disposed in a same layer as the first gate electrode,
     an active layer provided on the source electrode,
     a drain electrode provided on the active layer, and
     a data line and a gate line that are provided on the base substrate and cross with each other vertically and horizontally,
   wherein the gate insulating layer is disposed between the first gate electrode and the source electrode; and
   wherein the data line comprises:
     a plurality of first data regions disposed in a same as the gate line and insulated from the gate line, and
     a second data region provided on the first data regions and connected to adjacent first data regions,
     wherein the second data region and the gate line are partially overlapped with each other in an orthographic projection direction.

2. The array substrate according to claim 1, wherein the gate insulating layer is disposed on the first data regions and the gate line, first via holes are disposed in a portion of the gate insulating layer corresponding to the first data regions, and the second data region is provided on the gate insulating layer and electrically connected to adjacent first data regions through the first via holes.

3. The array substrate according to claim 1, wherein the source electrode, the first gate electrode, the gate line and the first data regions of the data line are disposed in a same layer, and the source electrode and the second data region are provided in a same pattern layer.

4. The array substrate according to claim 1, wherein a first transparent conducting layer is disposed over the thin film transistor unit, and the first transparent conducting layer and the drain electrode are integrally formed and electrically connected with each other.

5. The array substrate according to claim 4, wherein a passivation layer is disposed on the drain electrode and the first transparent conducting layer, a second transparent conducting layer is disposed on the passivation layer, and the first transparent conducting layer comprises at least a portion that overlaps the second transparent conducting layer.

6. The array substrate according to claim 1, further comprising: a gate driver on array (GOA) unit provided on the base substrate, wherein
   the GOA comprises: a second gate electrode provided on the base substrate, and a conducting leading wire provided on the second gate electrode,
   wherein the first gate electrode and the second gate electrode are disposed in a same layer, and the conducting leading wire and the drain electrode are provided in a same pattern layer.

7. The array substrate according to claim 6, wherein a second via hole is disposed in a portion of the passivation layer corresponding to the conducting leading wire, and the second transparent conducting layer is electrically connected to the conducting leading wire through the second via hole.

8. The array substrate according to claim 5, wherein the first transparent conducting layer comprises a plate-like or a slit electrode, and the second transparent conducting layer comprises a slit electrode.

9. A display device, comprising the array substrate as claimed in claim 1.

10. A manufacturing method of an array substrate, the array substrate comprising a thin film transistor unit, the thin film transistor unit comprising a first gate electrode, a gate insulating layer, an active layer, a source electrode and a drain electrode, a gate line and a data line that cross with each other vertically and horizontally, the data line comprising adjacent first data regions spaced by the gate line and a second data region electrically connected to adjacent first data regions,
   and the method comprising:
     forming a pattern that comprises the first gate electrode and the source electrode on a base substrate, wherein the first gate electrode and the source electrode are formed in a same layer;
     forming a pattern that comprises the gate insulating layer on the above-mentioned pattern that comprises the first gate electrode and the source electrode, and forming a pattern that comprises the active layer on the source electrode, wherein the gate insulating layer is formed on the first gate electrode and between patterns of the first gate electrode and the source electrode; and forming a pattern that comprises the drain electrode on the active layer;

wherein a pattern that comprises the first gate electrode, the source electrode, the gate line, and the first data regions of the data line is formed in a same layer on the base substrate;

after a pattern that comprises the active layer is formed on the source electrode, a pattern of first via holes is formed in the gate insulating layer corresponding to the first data regions; and a pattern that comprises the drain electrode, the second data region of the data line is formed on the active layer, and the second data region is electrically connected to the adjacent first data regions through the first via holes.

11. The manufacturing method according to claim 10, wherein a first transparent conducting layer is disposed on the thin film transistor unit, wherein a pattern that comprises the drain electrode and the first transparent conducting layer is formed in a same layer on the active layer.

12. The manufacturing method according to claim 11, further comprising: forming a pattern that comprises a passivation layer and a pattern of a second transparent conducting layer on a pattern of the drain electrode sequentially.

13. The manufacturing method according to claim 12, the array substrate further comprising forming a gate driver on array (GOA) unit, the GOA unit comprising a second gate electrode and a conducting leading wire, wherein a pattern that comprises the first gate electrode, the source electrode, the gate line, the first data regions of the data line, and the second gate electrode is formed in a same layer on the base substrate; and a pattern that comprises the drain electrode, the first transparent conducting layer, the second data region of the data line and the conducting leading wire is formed on the active layer.

14. The manufacturing method according to claim 13, wherein the pattern that comprises the passivation layer and the pattern of the second transparent conducting layer are sequentially formed on the pattern of the drain electrode, a pattern of a second via hole is formed in a portion of the passivation layer corresponding to the conducting leading wire, and the second transparent conducting layer is electrically connected to the conducting leading wire through the second via hole.

15. The manufacturing method, according to claim 10 wherein a metal thin film and a semiconductor thin film are sequentially formed on the base substrate, a pattern that comprises the first gate electrode of the thin film transistor unit, the source electrode and the active layer, the gate line, first data regions of a data line and a second gate electrode of a gate driver on array unit (GOA) is etched and formed through a first masking process; a first insulating thin film is formed, a pattern that comprises the gate insulating layer is formed through a second masking process, and a pattern of first via holes is formed in the gate insulating layer corresponding to the first data regions;

a first transparent thin film is formed, a pattern that comprises the drain electrode of the thin film transistor unit and a first transparent conducting layer, the second data region of the data line and a conducting leading wire of the GOA unit is etched and formed on the active layer through a third masking process, and the second data region and adjacent first data regions are electrically connected through the first via holes;

a second insulating thin film is formed, a pattern that comprises a passivation layer is etched and formed on a pattern of the drain electrode through a fourth masking process, and a pattern of a second via hole is formed in a portion of the passivation layer corresponding to the conducting leading wire; and a second transparent conducting layer is formed, a pattern that comprises the second transparent conducting layer is etched and formed through a fifth masking process, and the second transparent conducting layer and the conducting leading wire are electrically connected through the second via hole.

* * * * *